US008962968B2

(12) United States Patent
Brillet

(10) Patent No.: US 8,962,968 B2
(45) Date of Patent: Feb. 24, 2015

(54) THERMOELECTRIC GENERATION FOR A GAS TURBINE

(75) Inventor: Christophe Brillet, Gan (FR)

(73) Assignee: Turbomeca, Bordes (FR)

( * ) Notice: Subject to any disclaimer, the term of this patent is extended or adjusted under 35 U.S.C. 154(b) by 873 days.

(21) Appl. No.: 13/148,163

(22) PCT Filed: Feb. 4, 2010

(86) PCT No.: PCT/FR2010/050176
§ 371 (c)(1),
(2), (4) Date: Aug. 5, 2011

(87) PCT Pub. No.: WO2010/089505
PCT Pub. Date: Aug. 12, 2010

(65) Prior Publication Data
US 2011/0283712 A1   Nov. 24, 2011

(30) Foreign Application Priority Data

Feb. 6, 2009   (FR) ...................................... 09 50739

(51) Int. Cl.
*H01L 35/30*   (2006.01)
*B64D 41/00*   (2006.01)
*F02K 1/82*   (2006.01)

(52) U.S. Cl.
CPC ................ *H01L 35/30* (2013.01); *B64D 41/00* (2013.01); *F02K 1/82* (2013.01); *F02K 1/822* (2013.01); *Y02T 50/53* (2013.01); *Y02T 50/675* (2013.01); *F05D 2260/20* (2013.01)
USPC ................ 136/200; 60/801; 62/3.2; 165/164

(58) Field of Classification Search
CPC ........... H01L 35/30; B64D 41/00; F02K 1/82; F02K 1/822; Y02T 50/53; Y02T 50/675; F05D 2260/20
USPC ................ 60/801; 136/200–242; 62/3.2–3.7; 165/163, 164, 165
See application file for complete search history.

(56) References Cited

U.S. PATENT DOCUMENTS

| 6,613,972 B2 * | 9/2003 | Cohen et al. ................ 136/209 |
| 6,840,762 B2 * | 1/2005 | Maruta et al. ................ 431/328 |
| 6,951,456 B2 * | 10/2005 | Cohen et al. ................ 431/215 |
| 6,987,329 B1 * | 1/2006 | Smith et al. ................ 290/2 |

(Continued)

FOREIGN PATENT DOCUMENTS

| CZ | 2002 1405 | 12/2003 |
| DE | 199 46 806 | 4/2001 |

(Continued)

OTHER PUBLICATIONS

International Search Report Issued Jun. 4, 2010 in PCT/FR10/050176 filed Feb. 4, 2010.

(Continued)

*Primary Examiner* — William H Rodriguez
*Assistant Examiner* — Carlos A Rivera
(74) *Attorney, Agent, or Firm* — Oblon, Spivak, McClelland, Maier & Neustadt, L.L.P.

(57) ABSTRACT

A device for producing electrical power in a gas turbine or the like of an aircraft, the device including a plurality of thermoelectric cells having a face surrounding a hot source. A cold source is constituted by a cold fluid flowing over the other face of the thermoelectric cells.

7 Claims, 2 Drawing Sheets

(56) References Cited

U.S. PATENT DOCUMENTS

2009/0159110 A1* 6/2009 Kwok et al. ................ 136/205
2010/0058731 A1 3/2010 Haehner et al.

FOREIGN PATENT DOCUMENTS

| DE | 10 2007 036 930 | 4/2009 |
|---|---|---|
| FR | 1 504 078 | 12/1967 |
| JP | 2001 263088 | 9/2001 |
| JP | 2001-263088 A | 9/2001 |
| JP | 2003-533956 A | 11/2003 |
| WO | 01 61768 | 8/2001 |
| WO | 2008 139096 | 11/2008 |

OTHER PUBLICATIONS

Japanese Office Action issued Mar. 4, 2014 in Patent Application No. 2011-548749 (English Translation only).

* cited by examiner

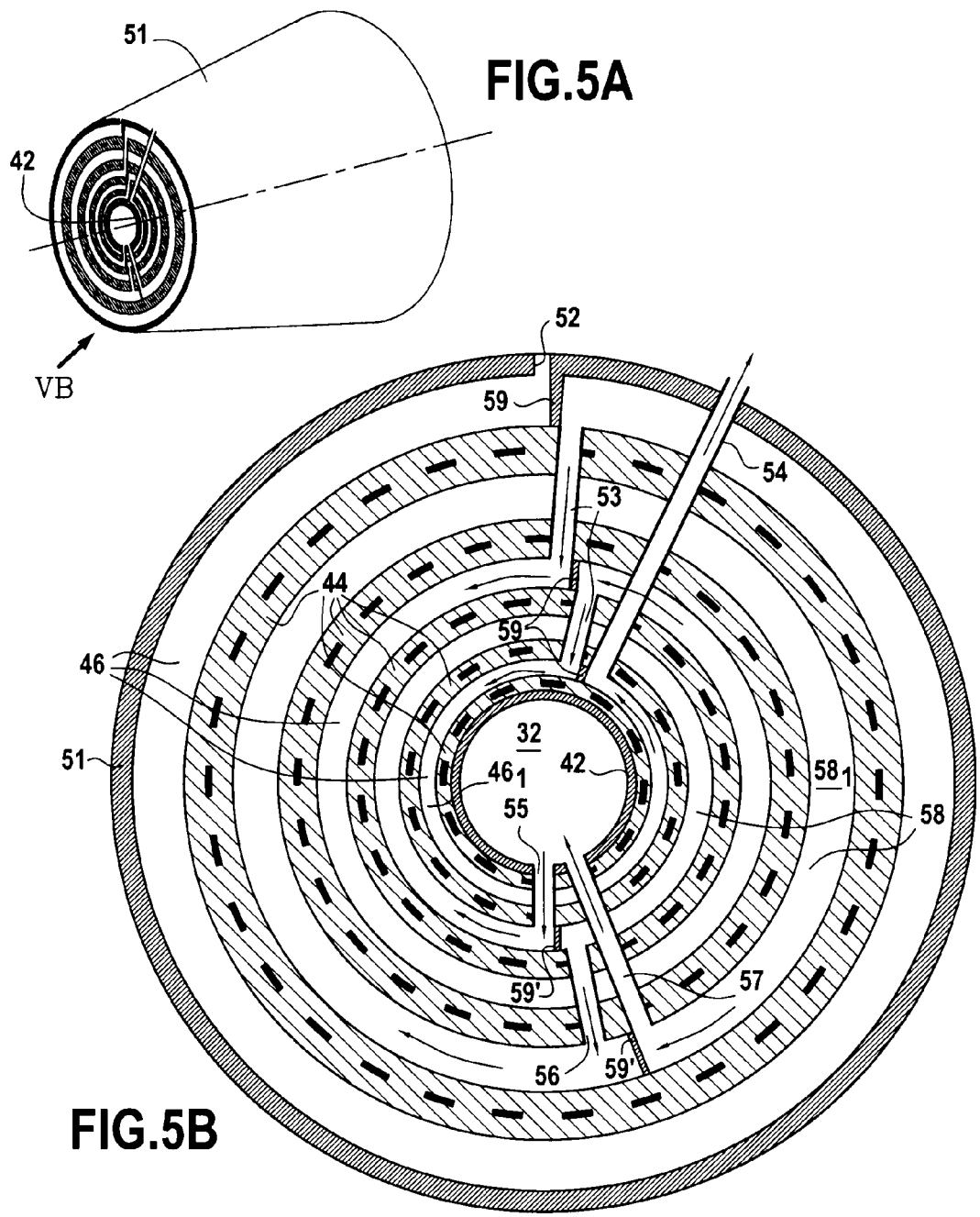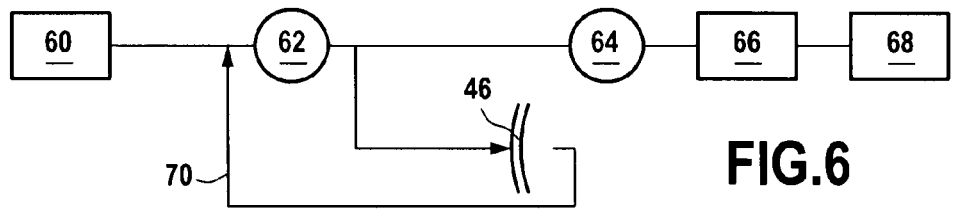

THERMOELECTRIC GENERATION FOR A GAS TURBINE

DOMAIN OF THE INVENTION

The present invention relates to a device for producing electrical power for an aircraft gas turbine or the like.

BACKGROUND OF THE INVENTION

Aircraft consume a non-negligible quantity of electricity in their internal equipment. That electrical power is generally produced by an alternator that takes off mechanical power from the gas turbine. It is therefore advantageous to have means for producing electrical power that do not increase the fuel consumption of the aircraft.

Furthermore, thermoelectric cells are known that are capable of producing electrical power under the effects of a temperature difference applied thereto.

Accompanying FIG. 1 shows such a thermoelectric cell 10. It is essentially constituted by a semiconductor junction made up of two elements 12 and 14 that are doped respectively to be of type N and of type P. Those two elements are connected together by an electrical conductor 16 and they have respective electrical connections forming terminals 18 and 19. Usually, that assembly constituting a unit thermoelectric cell is mounted between two electrically insulating supports such as the supports 20 and 22, for example, that facilitate fastening such a cell on another component. Naturally, a plurality of individual cells may be associated with one another.

It is also known that the efficiency or yield of such cells is directly proportional to the temperature difference that exists between the two faces of such a cell, e.g. constituted by the insulating supports 20 and 22.

PCT patent application WO 2005/017331 describes a thermoelectric power generator for a gas turbine engine, in particular for propelling aircraft.

In that patent application, proposals are made to place ring-shaped sets of thermoelectric cells around a hot zone, but without the mounting conditions for said tests of thermoelectric cells being specified.

Unfortunately, as mentioned above, the efficiency of such equipment for producing electrical power depends very directly on the temperature difference between the hot source and the cold source between which the thermoelectric cells are interposed.

OBJECTS AND SUMMARY OF THE INVENTION

An object of the present invention is to provide a device for producing electrical power for an aircraft gas turbine or the like, which device enables significantly improved efficiency to be obtained from the thermoelectric cells without significantly increasing the fuel consumption of the aircraft.

In order to achieve this object of the invention, the device for a producing electrical power in a gas turbine or the like of an aircraft, comprises a plurality of thermoelectric cells having a face surrounding a hot source, and it is characterized in that the cold source is constituted by a cold fluid flowing over the other face of said thermoelectric cells.

It can be understood that in this embodiment, it is the flow of cold fluid that constitutes the cold source applied to the thermoelectric cells, thereby improving the energy efficiency thereof.

In a preferred first embodiment, the electrical power production system is characterized in that said cold fluid is selected from the group comprising: fuel for said turbine; cooling or lubrication oil; air taken from the compressors of said turbine; air for cooling the engine compartment; and air outside said turbine.

It can be understood that using the fluids in the above list and in particular using cooling oil or fuel gives rise to high cooling capacity, while leading to substantially no additional fuel consumption since, naturally, the cooling oil or fuel is recycled.

In a first embodiment, the hot source is constituted by the wall of the nozzle of said turbine heated by convection by the exhaust gases.

In another embodiment, the system is characterized in that said cold source is constituted by at least one annular zone into which said cold fluid is introduced. The inside wall of said annular zone is in contact with the support of said thermoelectric cells. The outer wall of said annular zone is the outer casing and it is cooled by convection by the cold fluid.

Also preferably, the device is characterized by an alternation of concentric annular zones in which the cold source and the exhaust gases flow in alternation. Thermoelectric cells are placed between each of the annular zones.

It can be understood that by having these annular zones with the thermoelectric cells interposed between them, a counterflow heat exchanger is provided, thereby considerably improving the overall efficiency of the electrical power production device.

More precisely, the hot source is constituted by at least one annular zone in which there flows a fraction of the exhaust gas (constituting the hot fluid) with spiral movement towards the outer radii; and by at least one annular zone in which the cold fluid flows with spiral movement towards the inner radii. At least one annular assembly of thermoelectric cells is mounted concentrically in such a manner that one of the faces of the assembly is in contact with the cold fluid and the other face is in contact with the hot fluid, thereby constituting a counterflow cylindrical heat exchanger.

The present invention also provides the use of the electrical power production device of the invention for powering accessories of the gas turbine with electricity, such as for example the full authority digital engine controller (FADEC) or pumps that are driven by electric motors.

Finally, the present invention provides a helicopter turbine engine including an electrical power production device of the invention. The thermoelectric cells of said device are preferably mounted on an exhaust nozzle of the turbine engine.

BRIEF DESCRIPTION OF THE DRAWINGS

Other characteristics and advantages of the invention appear better on reading the following description of several embodiments of the invention given as non-limiting examples. The description refers to the accompanying figures, in which:

FIG. 5A is a perspective view of a nozzle of an aircraft gas turbine fitted with a heat exchanger for improving the overall efficiency of the electrical power production device;

FIG. 5B is an end view of the nozzle fitted with heat exchangers as seen looking along arrow VB of FIG. 5A; and FIG. 6 is a diagram showing an example of how fuel can be taken to constitute the cold source.

MORE DETAILED DESCRIPTION

Figure 2:
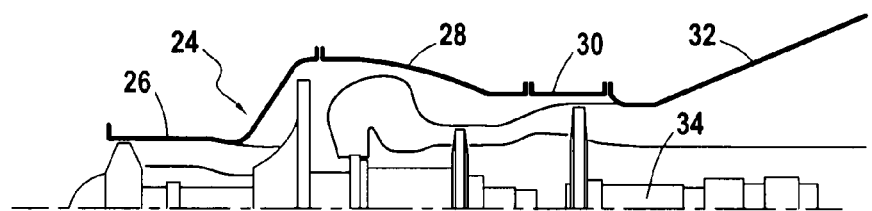
FIG. 2 is a half-view in longitudinal section of an aircraft gas turbine suitable for being fitted with the electrical power production device.

FIG. 2 shows in simplified manner an example of an aircraft gas turbine suitable for being fitted with an electrical power production device of the invention. In this figure, there can be seen a gas turbine 24 with its compressor casing 26, its high pressure turbine casing 28, its free turbine casing 30, and its outlet nozzle 32. There can also be seen the shaft of the free turbine 34 of said gas turbine.

In the embodiments of the electrical power production device that are described below, the device is mounted or in association with the outlet nozzle 32 of the gas turbine. The device could optionally be placed on some other hot part of the turbine.

Figure 1:
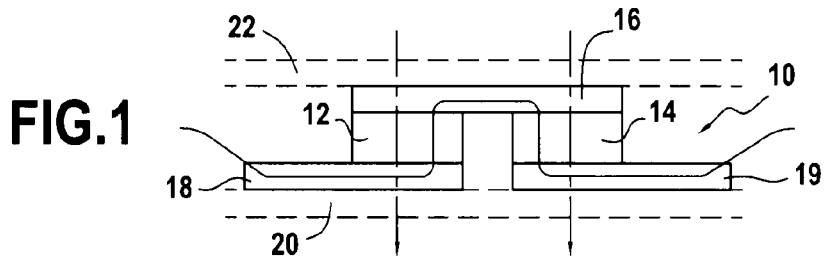
FIG. 1, described above, shows one possible embodiment of a thermoelectric cell suitable for use in the invention.
Figure 3:
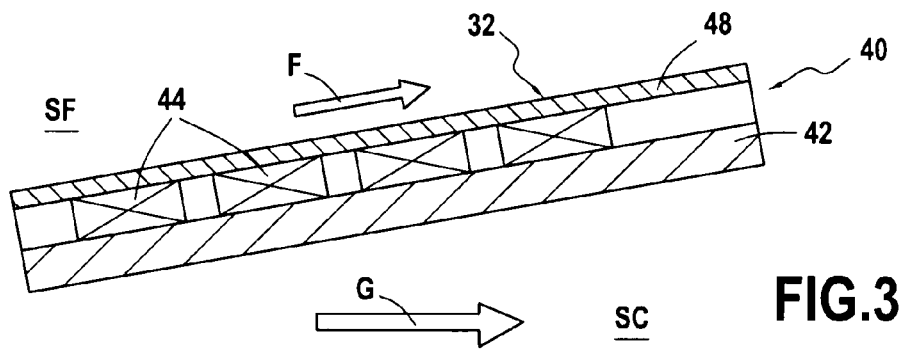
FIG. 3 shows a first embodiment of the electrical power production device.

In the first embodiment shown in FIG. 3, the electrical power production device 40 is mounted directly on the outside wall 42 of the nozzle 32. The electrical power generation device 40 is preferably constituted by sets of thermoelectric cells that are associated with one another to form annular assemblies 44 that are distributed regularly along the length of the wall 42 of the nozzle 32. Each annular ring is naturally constituted by a sequence of thermoelectric cells of the type shown in FIG. 1 that are interconnected electrically and in which the mechanical supports 22 and 20 are flexible so as to be able to fit together over the surface of revolution formed by the wall 42 of the nozzle 32. Thus, the first face of the thermoelectric conversion elements 44 is in contact via a heat bridge with the outside face of the wall 42 of the nozzle 32, while the second face of the thermoelectric conversion elements 44 is in contact with the outside air that thus acts as a cold source SF, preferably an outside wall 48 (possibly fitted with disturbers) is provided forming a heat bridge. The hot source SC, as explained above, is constituted by the exhaust gas G flowing in the nozzle 32 and heating the inside wall 42 of the nozzle 32 by convection.

Figure 4:
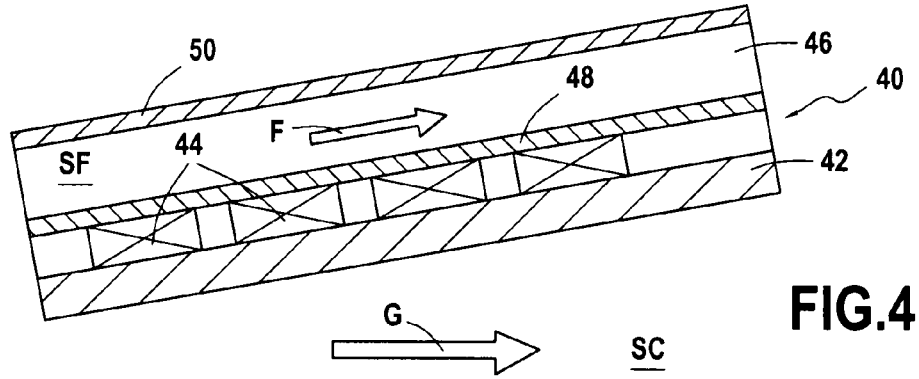
FIG. 4 shows a first variant embodiment of the electrical power production device.

In FIG. 4, there can be seen a variant embodiment of the electrical power production device in which the hot source SC is still constituted by the wall 42 of the nozzle 32, but the cold source SF is constituted by a flow of cold fluid F in an annular space 46 defined by an inside wall 48 in contact with the second faces of the thermoelectric conversion elements 44 and by an outside wall 50. This obtains a better flow of cold fluid and better heat exchange with the thermoelectric cells 44 since baffles may be provided with the annular space 46. This embodiment naturally also makes it possible to use some cold fluid other than air, e.g. cooling oil or fuel. Nevertheless, it is always possible to use the outside air or cold air taken from various portions of the gas turbine.

FIGS. 5A and 5B show a third embodiment of the electrical power production device.

In these figures, there can be seen the wall 42 of the nozzle 32 that acts as the inside wall, and the wall 51 that is the outside wall of the nozzle 32. The cold fluid F (cold air, cooling oil, or fuel) arrives via the inlet tube(s) 52 and then flows (in the direction defined as positive by convention) in the concentric annular zones 46 while describing a spiral movement towards the center of the nozzle. Leaktight radial partitions 59 are arranged in such a manner as to direct the cold fluid F so that it follows said spiral movement in association with tubes 53 providing communication between the annular zones 46. In the last annular zone (smallest radius) 46$_1$, the cold fluid F is exhausted to the outside through the tube(s) 54.

The hot fluid G (nozzle exhaust gas) is taken from the nozzle exhaust gas by the inlet tube(s) 55 and then flows (in the direction defined as negative by convention) in the annular zones 58 describing a spiral movement towards the outside of the nozzle, starting from the exhaust gas zone 32. Leaktight partitions 59' are arranged in such a manner as to channel the hot fluid G so as to describe said spiral movement in association with tubes 56 putting the annular zones 58 into communication. In the last annular zone 58$_1$ (of largest radius), the hot fluid G is returned to the main flow of exhaust gas in the nozzle via the tube(s) 57.

Several annular assemblies of thermoelectric cells 44 are mounted concentrically in such a manner that one of the faces of each assembly is in contact with the cold fluid F and the other face is in contact with the hot fluid G. This provides a counterflow cylindrical heat exchanger.

FIG. 6 relates to the special circumstance in which the cold fluid is constituted by fuel, and it shows one possible way of feeding the annular zone 46 (which may be constituted by a plurality of concentric rings as described for the device of FIG. 5B) constituting the cold source of the electrical power production device. In FIG. 6, there can be seen the fuel tank 60 with a low pressure pump 62 that is connected to a high pressure pump 64 that delivers fuel under pressure to a regulator 66, itself connected to the injectors 68 of the combustion chamber. Fuel is taken at a low rate from the outlet of the low pressure pump 62 in order to feed the annular zone 46 constituting the cold source with fuel. After flowing through the annular zone 46, the fuel is reinjected to the inlet of the low pressure pump 62 by a tube 70.

The invention claimed is:

1. A device for producing electrical power in a gas turbine or the like of an aircraft, the device comprising:
    a plurality of thermoelectric cells having a first face surrounding a hot source, a cold source being constituted by a cold fluid flowing over a second face of the thermoelectric cells,
    wherein the cold source includes a first annular zone into which the cold fluid is introduced, a first wall of the first annular zone forming a thermal bridge with the second faces of the thermoelectric cells, a second wall of the first annular zone being an outer envelope of the device;
    wherein the hot source includes a second annular zone in which there flows a fraction of exhaust combustion gas of the gas turbine constituting a hot fluid with a spiral movement radially outward from an hot source inlet provided at a center of the device;
    wherein the cold source includes the first annular zone in which there follows the cold fluid with a spiral movement radially inward from a cold source inlet provided at the second wall towards the center of the device;
    wherein the cold source includes a cold source outlet provided at the second wall of the device through which the cold fluid flows radially outward to exit the device, and the hot source includes a hot source outlet provided at the center of the device through which the hot fluid flows radially inward to exit the device; and
    wherein at least one annular assembly of thermoelectric cells is mounted concentrically so that one of the faces of the assembly is in contact with the cold fluid and the other face is in contact with the hot fluid, thereby providing a counterflow cylindrical heat exchanger.

2. An electrical power production device according to claim 1, wherein the cold fluid is selected from the group comprising: fuel for the gas turbine; cooling or lubrication oil; air taken from compressors of the gas turbine; air for cooling an engine compartment; and air outside the gas turbine.

3. A device according to claim 1, wherein the hot source includes a wall of a nozzle of the gas turbine heated by convection by the exhaust combustion gases.

4. A device according to claim 2, wherein the hot source includes a wall of a nozzle of the gas turbine heated by convection by the exhaust combustion gases.

5. A device according to claim 1, comprising a plurality of interconnected annular zones in which there flows the fraction of the exhaust combustion gas, a plurality of interconnected annular zones in which there flows the cold fluid, and a plurality of annular assemblies of the thermoelectric cells, each annular assembly being disposed between an annular zone for the exhaust combustion gas and an annular zone for the cold fluid.

6. A method for producing electrical power for electrically powering accessories of a gas turbine, comprising:
　providing a device,
　providing a plurality of thermoelectric cells to the device having a first face surrounding a hot source, a cold source being constituted by a cold fluid flowing over a second face of the thermoelectric cells,
　introducing cold fluid into the device as the cold source, the cold source including a first annular zone into which the cold fluid is introduced with a spiral movement radially inward from a cold source inlet provided at the second wall towards a center of the device, a first wall of the first annular zone forming a thermal bridge with the second faces of the thermoelectric cells, a second wall of the first annular zone being an outer envelope of the device; and
　introducing a fraction of exhaust combustion gas of the gas turbine into the device as a hot fluid, the hot source including a second annular zone in which the fraction of exhaust combustion gas flows with a spiral movement radially outward from an hot source inlet provided at the center of the device;
　wherein the cold source includes a cold source outlet provided at the second wall of the device through which the cold fluid flows radially outward to exit the device, and the hot source includes a hot source outlet provided at the center of the device through which the hot fluid flows radially inward to exit the device, and
　wherein the thermoelectric cells are provided as at least one annular assembly of thermoelectric cells mounted concentrically so that one of the faces of the assembly is in contact with the cold fluid and the other face is in contact with the hot fluid, thereby providing a counterflow cylindrical heat exchanger.

7. A helicopter turbine engine including an electrical power production device according to claim 1.

\* \* \* \* \*